(12) United States Patent
Beckhart et al.

(10) Patent No.: US 6,789,328 B2
(45) Date of Patent: Sep. 14, 2004

(54) SEMICONDUCTOR LOAD PORT ALIGNMENT DEVICE

(75) Inventors: Gordon Haggott Beckhart, Colorado Springs, CO (US); Patrick Rooney Conarro, Green Mountain Falls, CO (US); Kevin James Harrell, Woodland Park, CO (US); Kamran Michael Farivar-Sadri, Colorado Springs, CO (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/120,744

(22) Filed: Apr. 11, 2002

(65) Prior Publication Data

US 2002/0148132 A1 Oct. 17, 2002

Related U.S. Application Data

(60) Provisional application No. 60/284,396, filed on Apr. 17, 2001.

(51) Int. Cl.[7] .............................................. G01D 21/00
(52) U.S. Cl. ............................. 33/645; 33/613; 33/533
(58) Field of Search ......................... 33/645, 533, 613, 33/549, 555

(56) References Cited

U.S. PATENT DOCUMENTS

| | | | | |
|---|---|---|---|---|
| 5,444,637 A | * | 8/1995 | Smesny et al. | ............. 702/127 |
| 6,300,644 B1 | * | 10/2001 | Beckhart et al. | ........ 250/559.33 |
| 6,307,211 B1 | * | 10/2001 | Beckhart et al. | ........ 250/559.33 |
| 6,453,574 B1 | * | 9/2002 | Chen | ............................ 33/645 |
| 6,519,502 B2 | * | 2/2003 | Chao | ............................. 700/213 |
| 6,533,521 B1 | * | 3/2003 | Todorov et al. | ......... 414/217.1 |
| 2002/0038773 A1 | * | 4/2002 | Fujimori et al. | ............. 206/454 |
| 2002/0044859 A1 | * | 4/2002 | Lee et al. | .................... 414/411 |
| 2002/0108842 A1 | * | 8/2002 | Bonora et al. | ........... 198/836.1 |
| 2003/0046998 A1 | * | 3/2003 | Seita | ............................ 73/431 |
| 2003/0047233 A1 | * | 3/2003 | Rush et al. | .................... 141/98 |
| 2003/0049101 A1 | * | 3/2003 | Seita | ............................ 414/217 |
| 2003/0049102 A1 | * | 3/2003 | Wu et al. | ................ 414/217.1 |
| 2003/0062578 A1 | * | 4/2003 | Dougan et al. | .............. 257/414 |

* cited by examiner

*Primary Examiner*—Christopher W. Fulton
*Assistant Examiner*—Yaritza Guadalupe
(74) *Attorney, Agent, or Firm*—Perman & Green, LLP; Richard Pickreign

(57) ABSTRACT

A semiconductor load port alignment device has a housing with a registration face and an alignment measurement face. A plurality of sensors are contained in the housing near the alignment measurement face. A processor is connected to the plurality of sensors.

19 Claims, 3 Drawing Sheets

SEMICONDUCTOR LOAD PORT ALIGNMENT DEVICE

RELATED APPLICATIONS

This patent claims priority on the provisional application having Serial No. 60/284,396, filed Apr. 17, 2001, entitled "Semiconductor 300 mm Load Port Alignment Tool".

FIELD OF THE INVENTION

The present invention relates generally to the field of semiconductor equipment and more particularly to a semiconductor load port alignment device.

BACKGROUND OF THE INVENTION

Semiconductor wafers are moved in and out of cassettes with automated handling devices. These automated tools need to be properly set up to pick up wafers and to properly return wafers to set positions. Leveling of every platform and all automated handling equipment is critical to smooth and cost effective operations.

When automated handlers and platforms are not properly set up, a number of problems can occur. In the most severe cases automated handlers can break wafers. Less severe misalignments can lead to wafer scratching and yield loss. The most common misalignment leads to wafers bumping into the cassette walls and scraping off particles.

One particular problem occurs in the new load ports. As semiconductor wafers have increased in size, the manufactures have developed factories that are completely automated. The wafers are moved about the factory in cassettes called FOUPs (Front Opening Unified Pods). When a FOUP is placed at a station for processing, the cover on the FOUP must be removed. If the cover cannot be removed, the whole process comes to a stand still. Less severe misalignments can lead to the yield losses note above. At present the most common alignment tools and methods for this area are bubble levels and eyeball alignment.

Thus there exists a need for a semiconductor load port alignment device that allows efficient and accurate alignment of FOUPs on load ports and their associated handling equipment.

DETAILED DESCRIPTION OF THE DRAWINGS

A semiconductor load port alignment device has a housing with a registration face and an alignment measurement face. A plurality of sensors are contained in the housing near the alignment measurement face. A processor is connected to the plurality of sensors. The sensors may be mechanical, electronic, sonic (ultrasonic) or optical. The registration face allows the housing to align with the load port station. The alignment measurement face is then able to determine the alignment of the automated handling device that removes the front cover of the FOUP (Front Opening Unified Pod).

Figure 1:
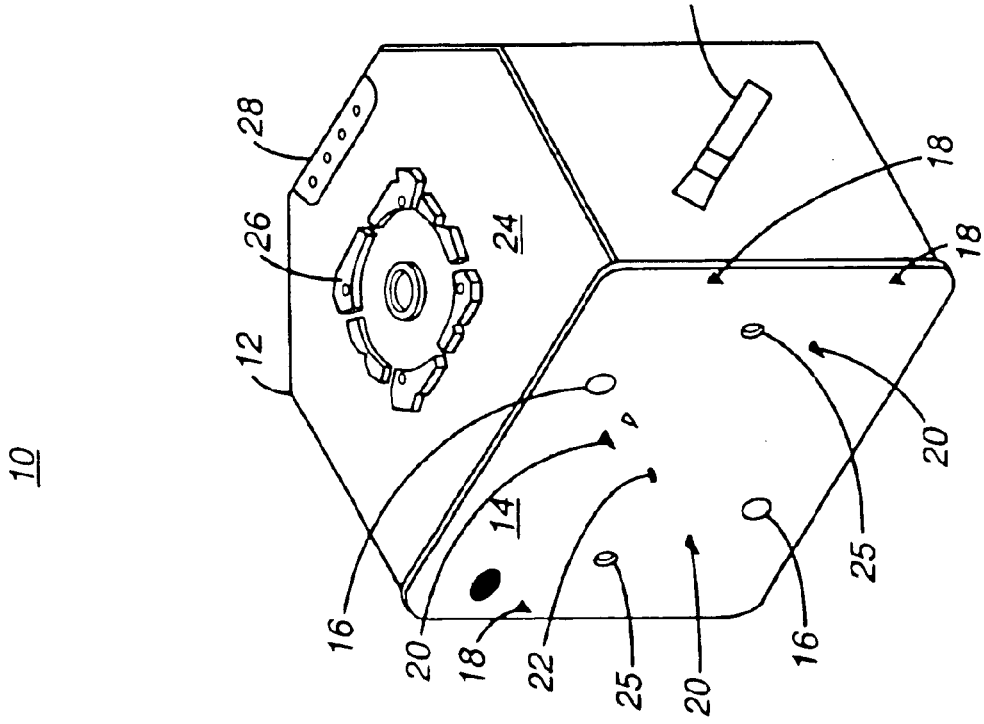
FIG. 1 is a top right perspective drawing of a semiconductor load port alignment device in accordance with one embodiment of the invention.

FIG. 1 is a top right perspective drawing of a semiconductor load port alignment device 10 in accordance with one embodiment of the invention. The device 10 has a housing 12 that has a shape substantially similar (form factor) to a FOUP. The housing 12 has an alignment measurement face 14 that has a plurality pin registration sensor openings 16. A plurality of sensors (second group) located in each of plurality pin registration sensor openings 16 are used to measure the position of the registration pins. A first group 18 of the plurality of sensors measures a plane formed by the semiconductor handling tool. This plane is the plane formed by the frame of the semiconductor handling tool. A second group 20 of the plurality of sensors measures another plane formed by the semiconductor handling tool. The second plane is the plane formed by the door face of the semiconductor handling tool. The alignment face 14 has a latch key opening(s) 25. In one embodiment, one of the plurality of sensors measures a rotation of the latch key. In one embodiment, the alignment face 14 includes one of the plurality of sensors that measures a force between the alignment tool and the automated semiconductor handling tool. A top face 24 has an automatic handling connector 26. This is the same type of connector that would be found on a FOUP. The device is powered by batteries in one embodiment and the housing 10 has a jack 28 for charging the batteries. A handle 30 is also provided on at least one face of the housing 12.

Figure 2:
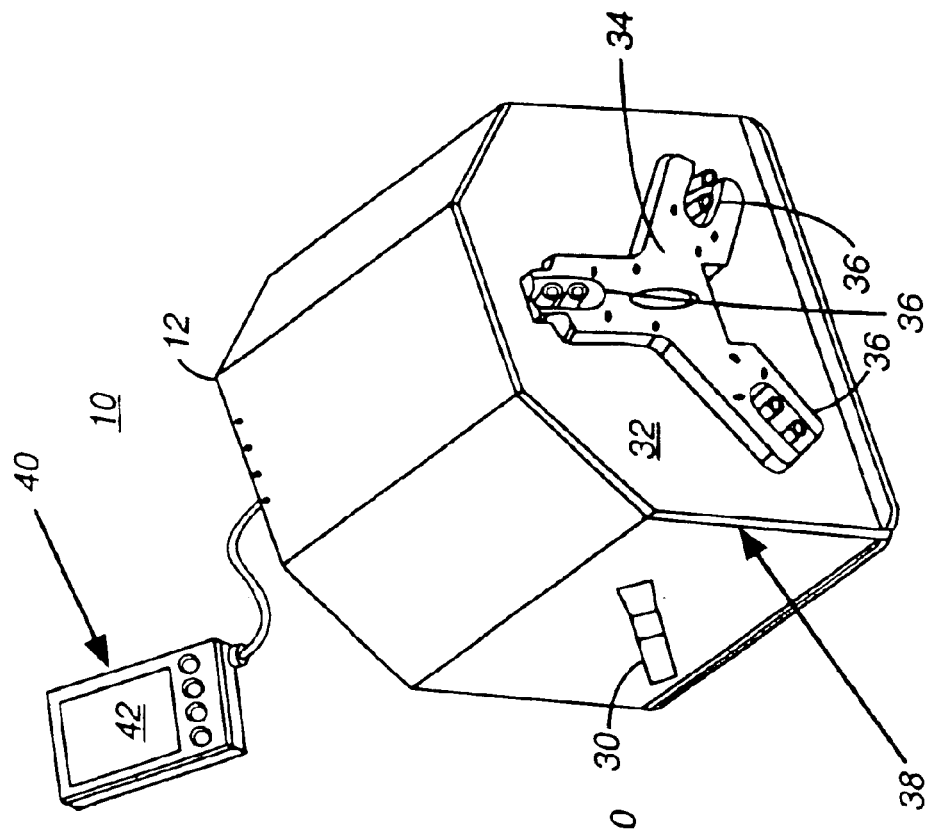
FIG. 2 is a bottom left perspective drawing of a semiconductor load port alignment device in accordance with one embodiment of the invention.

FIG. 2 is a bottom left perspective drawing of a semiconductor load port alignment device 10 in accordance with one embodiment of the invention. In this drawing the alignment measurement face 14 is down (not shown) and a registration face 32 is shown. The registration face 32 has a registration bracket 34 that includes registration slots 36. The registration slots 36 may reference on primary or secondary kinematic pins. In one embodiment, the device 10 includes an electronic level 38. The electronic level 38 and the plurality of sensors are coupled to a processor. In one embodiment the processor is a handheld computing device (palmtop) 40. All the information from the sensors may be displayed on the display 42 and stored in the handheld computing device 40. The handheld computing device 40 is shown connected by a cable, however a wireless connection is also possible.

Figure 3:
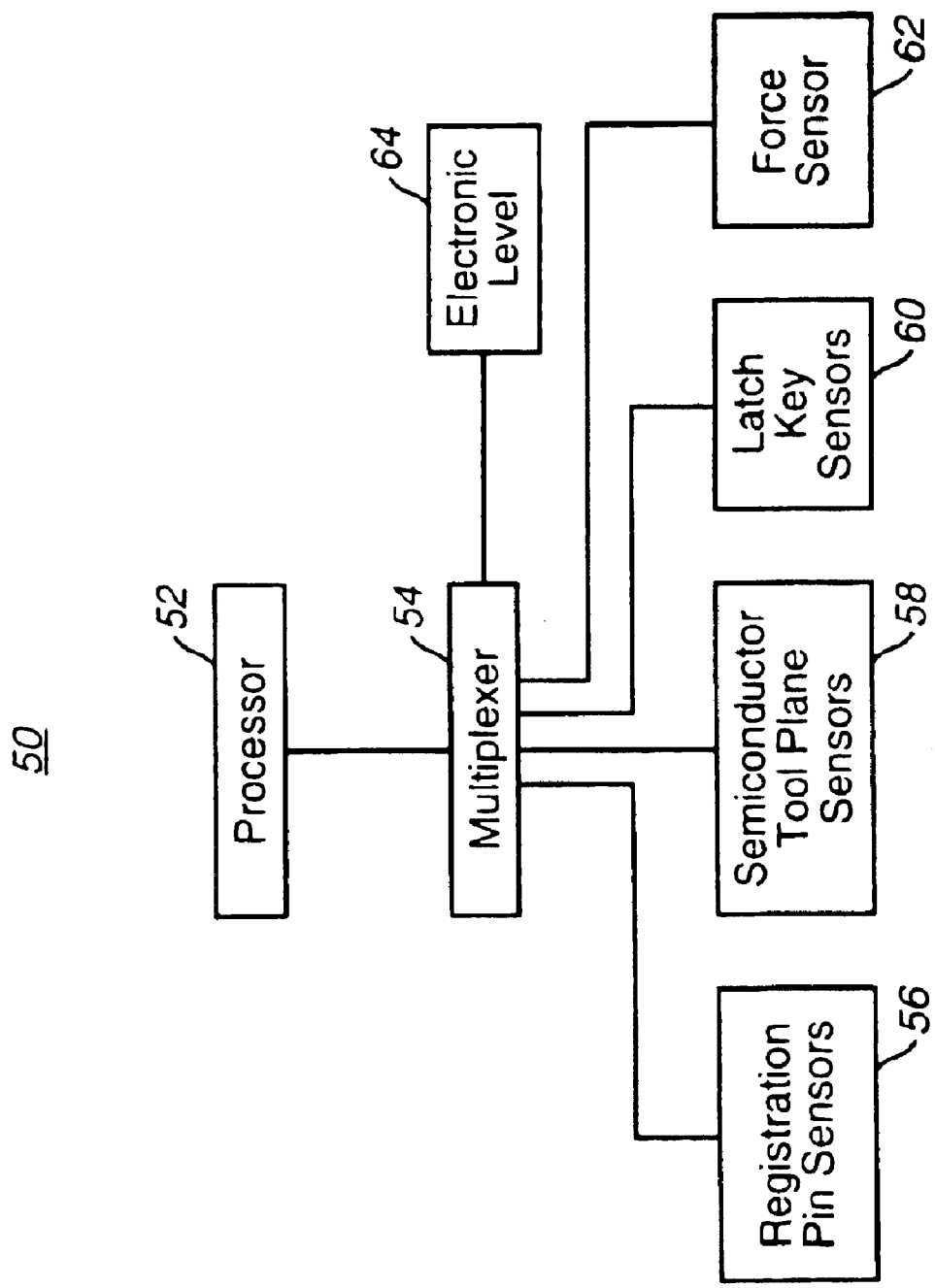
FIG. 3 is a block diagram of a semiconductor load port alignment device in accordance with one embodiment of the invention.

FIG. 3 is a block diagram of a semiconductor load port alignment device 50 in accordance with one embodiment of the invention. The semiconductor load port alignment device 50 has a processor 52. The processor 52 is coupled to a multiplexer 54. The multiplexer 54 is connected to a plurality of sensors. The sensors include registration pin sensors 56, semiconductor tool plane sensors 58, latch key sensors 60, force sensor 62 and electronic level 64. The multiplexer allows the processor to receive data from each of the sensor systems 56, 58, 60, 62, 64. The registration pin sensors 56 allow the operator to align the registration pins to the housing or a FOUP. The plane sensor 58 allows the operator to tell if the tool is in the same plane as the door of the FOUP. The latch key sensors 60 allow the operator to tell if the latch keys have the proper rotational alignment. The force sensor(s) 62 detect the force that the automated tool places on the FOUP. Some automated handling tools use a force measurement to determine when to stop. By measuring this force the device 50 may determine if the tool is applying too much force. The electronic level 64 allows the operator to determine if the load port is properly leveled. If the load port station is not properly leveled, then it is difficult for the automated handling tools to be properly aligned to the FOUP.

Figure 4:
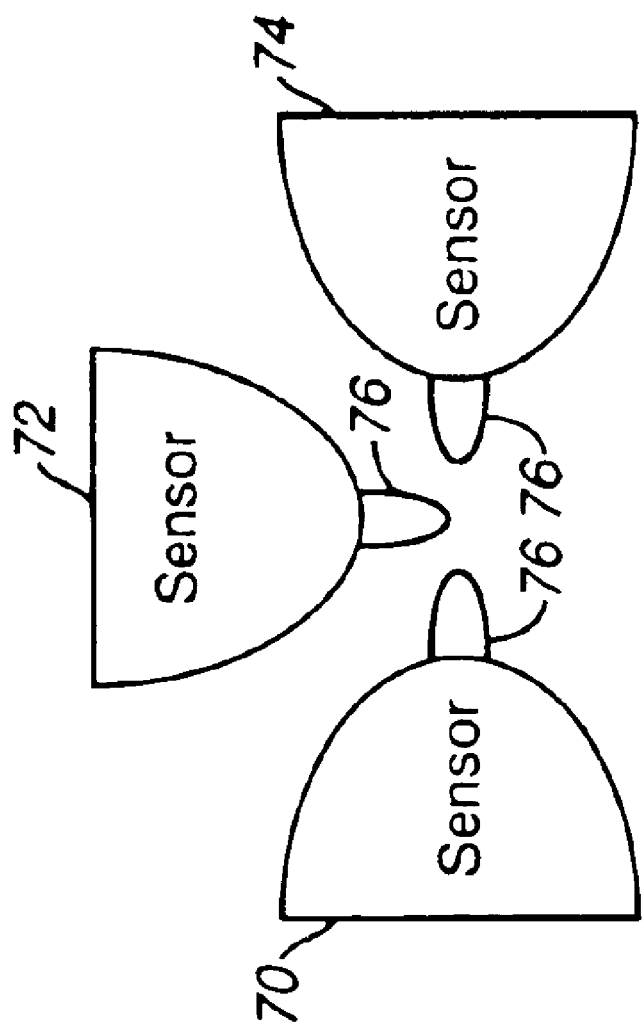
FIG. 4 is a conceptual drawing of a plurality of sensors used in a semiconductor load port alignment device in accordance with one embodiment of the invention.

FIG. 4 is a conceptual drawing of a plurality of sensors 70, 72, 74 used in a semiconductor load port alignment device in accordance with one embodiment of the invention. In the embodiment shown, the sensors 70, 72, 74 are mechanical sensors with probes 76. This arrangement of sensors is designed to measure the location of a registration pin. As the registration pin pushes against the probes 76 the sensor measures the deflection of the probes. As a result the location of the registration pin is known in a x-y plane. Other types of sensors may be used and the invention is not limited to the arrangement of sensors shown. The semiconductor tool plane sensor 58 may be implement as three mechanical sensors extending out from the alignment face of the housing. The latch key sensors are rotation sensors.

Thus there has been described a semiconductor load port alignment device that allows efficient and accurate alignment of FOUPs on load ports and their associated handling equipment.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A portable semiconductor load port alignment device, comprising:
   a portable housing having a registration face and a load port to semiconductor handling tool alignment measurement face;
   a plurality of sensors contained in the housing near the alignment measurement face; and
   a processor connected to the plurality of sensors.

2. The device of claim 1, wherein a first group of the plurality of sensors measure a plane formed by a semiconductor handling tool.

3. The device of claim 1, wherein a second group of the plurality of sensors measure a location of a registration pin.

4. The device of claim 1, wherein the housing has a face that contains an automatic handling connector.

5. The device of claim 1, further including an electronic level attached to the housing.

6. The device of claim 5, wherein the electronic level is connected to the processor.

7. A semiconductor load port alignment device, comprising:
   a housing having a registration face and an alignment measurement face;
   a plurality of sensors contained in the housing near the alignment measurement face; and
   a processor connected to the plurality of sensors,
   wherein one of the plurality of sensors measures a position of a latch key.

8. The device of claim 7, wherein the one of the plurality of sensors measures a rotation of a latch key.

9. A semiconductor load port alignment device, comprising:
   a housing having a registration face and an alignment measurement face;
   a plurality of sensors contained in the housing near the alignment measurement face; and
   a processor connected to the plurality of sensors,
   wherein one of the plurality of sensors measures a force.

10. A portable semiconductor load port alignment device, comprising:
    a portable housing;
    a registration pin sensor attached to the housing;
    a semiconductor handling tool plane sensor attached to the housing; and
    a processor connected to the semiconductor handling tool plane sensor.

11. The device of claim 10, wherein the housing has an automatic handling connector.

12. The device of claim 10, wherein the processor has a display.

13. The device of claim 10, wherein the processor is a handheld computing device.

14. The device of claim 10, further including an electronic level attached to the housing.

15. A semiconductor load port alignment device, comprising:
    a housing;
    a registration pin sensor attached to the housing;
    a semiconductor handling tool plane sensor attached to the housing; and
    a processor connected to the semiconductor handling tool plane sensor,
    further including a latch key sensor attached to the housing.

16. A semiconductor load port alignment device, comprising:
    a housing;
    a registration pin sensor attached to the housing;
    a semiconductor handling tool plane sensor attached to the housing; and
    a processor connected to the semiconductor handling tool plane sensor,
    further including a force sensor.

17. A portable semiconductor load port alignment device, comprising:
    a portable having a registration face and a load port to semiconductor handling tool alignment measurement face;
    an electronic level attached to the housing;
    a registration pin sensor attached to the housing; and
    a processor coupled to the electronic level.

18. The device of claim 17, wherein the housing has a form factor of a opening unified pod.

19. The device of claim 17, wherein the processor is a palmtop computer.

* * * * *